US009490302B2

(12) United States Patent
Park et al.

(10) Patent No.: US 9,490,302 B2
(45) Date of Patent: Nov. 8, 2016

(54) DISPLAY DEVICE AND MANUFACTURING METHOD THEREOF

(71) Applicant: Samsung Display Co., Ltd., Yongin-si, Gyeonggi-do (KR)

(72) Inventors: Yong-Hwan Park, Cheonan-si (KR); Jae-Seob Lee, Seoul (KR); Mi-Kyung Kim, Asan-si (KR)

(73) Assignee: Samsung Display Co., Ltd., Samsung-ro, Giheung-Gu, Yongin-si, Gyeonggi-Do (KR)

( * ) Notice: Subject to any disclaimer, the term of this patent is extended or adjusted under 35 U.S.C. 154(b) by 0 days.

(21) Appl. No.: 14/500,383

(22) Filed: Sep. 29, 2014

(65) Prior Publication Data

US 2015/0279911 A1    Oct. 1, 2015

(30) Foreign Application Priority Data

Mar. 31, 2014   (KR) .................. 10-2014-0037633

(51) Int. Cl.
| | | |
|---|---|---|
| *H01L 29/20* | (2006.01) | |
| *H01L 27/15* | (2006.01) | |
| *H01L 29/02* | (2006.01) | |
| *G02F 1/1335* | (2006.01) | |
| *H01L 27/32* | (2006.01) | |
| *H01L 51/56* | (2006.01) | |
| *H01L 51/00* | (2006.01) | |

(52) U.S. Cl.
CPC ....... *H01L 27/3218* (2013.01); *H01L 27/3213* (2013.01); *H01L 27/3246* (2013.01); *H01L 51/0011* (2013.01); *H01L 51/56* (2013.01)

(58) Field of Classification Search
CPC ........... H01L 27/3211; H01L 51/0059; H01L 51/0071; H01L 51/5096; H01L 51/0081; H01L 51/0085; H01L 51/5016; H01L 51/0078; H01L 51/5036; H01L 51/56; H01L 27/3218; H01L 27/3213; H01L 27/3246; H01L 51/0011
USPC .................. 257/89, 279, 79; 438/46, 99, 74; 445/49; 349/61, 106; 315/169.3
See application file for complete search history.

(56) References Cited

U.S. PATENT DOCUMENTS

| | | | |
|---|---|---|---|
| 6,281,634 B1 * | 8/2001 | Yokoyama ................. | 315/169.3 |
| 6,414,661 B1 * | 7/2002 | Shen et al. ....................... | 345/82 |
| 2004/0095521 A1 * | 5/2004 | Song et al. ..................... | 349/61 |
| 2004/0217694 A1 * | 11/2004 | Cok et al. ...................... | 313/504 |
| 2005/0110398 A1 | 5/2005 | Lee | |
| 2006/0105198 A1 * | 5/2006 | Spindler et al. .............. | 428/690 |
| 2009/0068918 A1 * | 3/2009 | Cok ................. | 445/49 |
| 2011/0242075 A1 * | 10/2011 | Yamamoto .................... | 345/207 |

FOREIGN PATENT DOCUMENTS

| | | |
|---|---|---|
| KR | 10-2005-0050488 A | 5/2005 |
| KR | 1020110013691 | 2/2011 |
| KR | 1020110108049 | 10/2011 |
| KR | 1020120041510 | 5/2012 |

* cited by examiner

*Primary Examiner* — Dzung Tran
(74) *Attorney, Agent, or Firm* — Robert E. Bushnell, Esq.

(57) ABSTRACT

A display device includes a substrate, and a group pixel on the substrate, the group pixel comprising at least two pixels that represent the same color, wherein in the group pixel, a distance between the pixels is smaller than a distance between adjacent pixels of different group pixels.

13 Claims, 10 Drawing Sheets

DISPLAY DEVICE AND MANUFACTURING METHOD THEREOF

CLAIM OF PRIORITY

This application claims priority to and the benefit of Korean Patent Application No. 10-2014-0037633, filed on Mar. 31, 2014, with the Korean Intellectual Property Office, the disclosure of which application is incorporated herein in its entirety by reference.

BACKGROUND OF THE INVENTION

1. Field of the Invention

The present disclosure of invention relates to a display device including red, green, and blue pixels that facilitate mask fabrication and pixel array suitable for high resolution and high aperture ratio, and a method of manufacturing the display device.

2. Description of the Related Art

Display devices include a plurality of pixels provided in an area defined by a black matrix or a pixel defining layer. The display devices are classified into, for example, liquid crystal displays (LCDs), organic light emitting diode displays (OLED displays), plasma display panels (PDPs), electrophoretic displays, and the like according to light emitting methods.

Among the display devices, the OLED display does not require a separate light source and has advantages such as low power consumption, high brightness, and short response time, and thus it is receiving attention as the next generation display of portable electronic devices.

The OLED display generally includes a hole injection electrode, a light emitting layer, and an electron injection electrode. In the OLED display, a hole supplied from the hole injection electrode and an electron supplied from the electron injection electrode are combined with each other in the light emitting layer to form an exciton, and light is emitted by energy generated when the exciton falls to a ground state.

The OLED display includes at least one of red, green, and blue pixels so as to display full color images. The red, green, and blue pixels include red, green, and blue emission layers, respectively. In this case, the red, green, and blue pixels are separated from each other by a predetermined distance or more in order to prevent a color mixture.

Meanwhile, the size of a pixel decreases as higher resolution displays are increasingly being used. However, in order to prevent a color mixture, a space between respective pixels cannot decrease although the pixel size decreases. Therefore, an aperture ratio of the pixel decreases as resolution becomes higher.

Also, an opening of a mask to deposit an emission layer-forming material on each pixel decreases in area, and thus mask fabrication is difficult.

It is to be understood that this background of the technology section is intended to provide useful background for understanding the here disclosed technology and as such, the technology background section may include ideas, concepts or recognitions that were not part of what was known or appreciated by those skilled in the pertinent art prior to corresponding effective filing dates of subject matter disclosed herein.

SUMMARY OF THE INVENTION

The present disclosure of invention is directed to a display device and to a mass production method of manufacturing the same. More specifically, the present disclosure is directed to a display device that has a pixel array suitable for high resolution and high aperture ratio and that facilitates mask fabrication.

According to an embodiment, a display device may include: a substrate; and a group pixel disposed on the substrate and including at least two pixels that represent the same color, wherein a distance between the pixels in the group pixel is smaller than a distance between adjacent pixels of different group pixels.

The group pixel may include four pixels that are disposed to be rectangular.

The group pixel may include four pixels of which two pixels each are disposed horizontally and vertically.

The group pixel may include two pixels disposed horizontally or vertically.

The group pixel may represent any one of red, green, and blue, the blue group pixel may be disposed diagonally, and the red and green group pixels may be disposed diagonally to each other.

The group pixel may represent any one of red, green, and blue, the red group pixel may be disposed diagonally, and the blue and green group pixels may be disposed diagonally to each other.

The group pixel may represent any one of red, green, and blue, the green group pixel may be disposed diagonally, and the red and blue group pixels may be disposed diagonally to each other.

The pixel may include: a first electrode on the substrate; a pixel defining layer disposed between the first electrodes and on an end portion of the first electrode; an emission layer on the first electrode; and a second electrode on the emission layer.

The emission layer may be applied on the pixel defining layer in the same group pixel.

According to an embodiment, a method for manufacturing a display device may include: preparing a substrate; forming a first electrode on the substrate; forming an emission layer on the first electrode; and forming a second electrode on the substrate on which the emission layer is formed, wherein the forming of an emission layer may use a mask having an opening corresponding to a group pixel in which a plurality of pixels representing the same color may be disposed to be rectangular.

The opening of the mask may have the same area as each group pixel.

The opening of the mask may have a larger area than each group pixel.

The group pixel may include four pixels that are formed to be rectangular.

The group pixel may include four pixels of which two pixels each are disposed horizontally and vertically.

The group pixel may include two pixels disposed horizontally or vertically.

According to embodiments of the present invention, a display device may include a group pixel consisting of a plurality of pixels representing the same color, thereby facilitating mask fabrication for deposition.

Further, according to embodiments of the present invention, a color mixture may not occur between a plurality of pixels in a group pixel, and thus a distance between respective pixels in the same group pixel may decrease. Consequently, a pixel size may increase, thereby enhancing an aperture ratio.

The foregoing is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The above and other features and aspects of the present disclosure of invention will be more clearly understood from the following detailed description taken in conjunction with the accompanying drawings, in which.

DETAILED DESCRIPTION OF THE INVENTION

Figure 1:
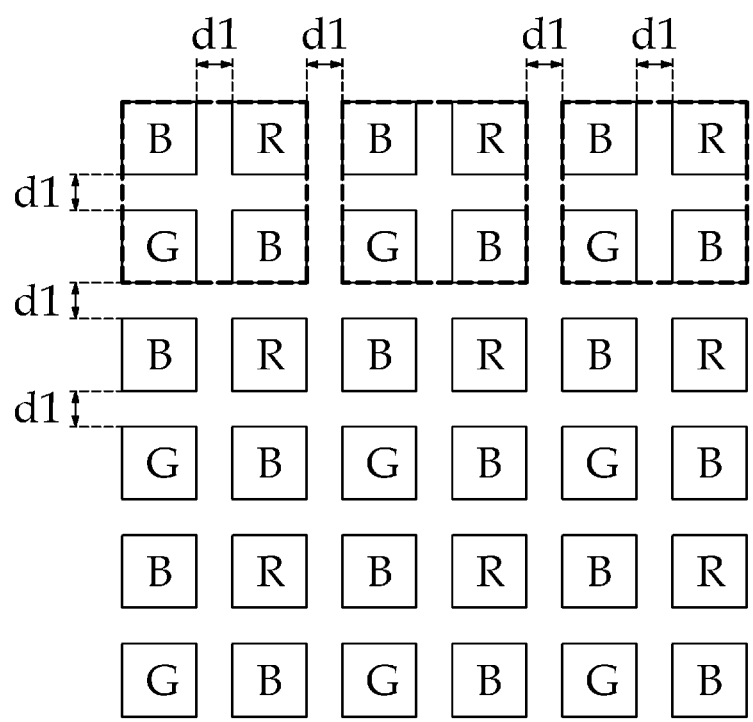
FIG. 1 is a display device having conventional pixels.

Advantages and features of structures formed in accordance with the present disclosure of invention and methods for achieving them will be made clear from embodiments described below in more detail with reference to the accompanying drawings. The present teachings may, however, be embodied in many different forms and should not be construed as being limited to the specific embodiments set forth herein. Rather, these embodiments are provided so that this disclosure will be thorough and complete, and will fully convey the scope of the present teachings to those skilled in the pertinent art. Like reference numerals refer to like elements throughout the specification.

The spatially relative terms "below", "beneath", "lower", "above", "upper", and the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device shown in the drawing is turned over, the device positioned "below" or "beneath" another device may be placed "above" another device. Accordingly, the illustrative term "below" may include both the lower and upper positions. The device may also be oriented in the other direction, and thus the spatially relative terms may be interpreted differently depending on the orientations.

The terminology used herein is for the purpose of describing particular embodiments only and is not construed as limiting the invention. As used herein, the singular forms "a," "an" and "the" are intended to include the plural forms as well, unless the context clearly indicates otherwise. It will be further understood that the terms "comprises" and/or "comprising," when used in this specification, specify the presence of mentioned component, step, operation and/or element, but do not exclude the presence or addition of one or more other components, steps, operations and/or elements.

Unless otherwise defined, all terms used herein (including technical and scientific terms) have the same meaning as commonly understood by those skilled in the art to which this disclosure of invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the present specification.

FIG. 1 is a display device having conventional pixels. Referring to FIG. 1, the distance between adjacent pixels (e.g. blue pixel B, red pixel R, and green pixel G) is d1 which is restricted by a minimum distance to avoid color mixture that can lower the quality of displayed image. In this display device, since d1 cannot be smaller than the minimum distance to avoid the occurrence of color mixture, to increase the resolution, the pixel size has to be reduced, resulting in lowered aperture ratio.

Figure 2:
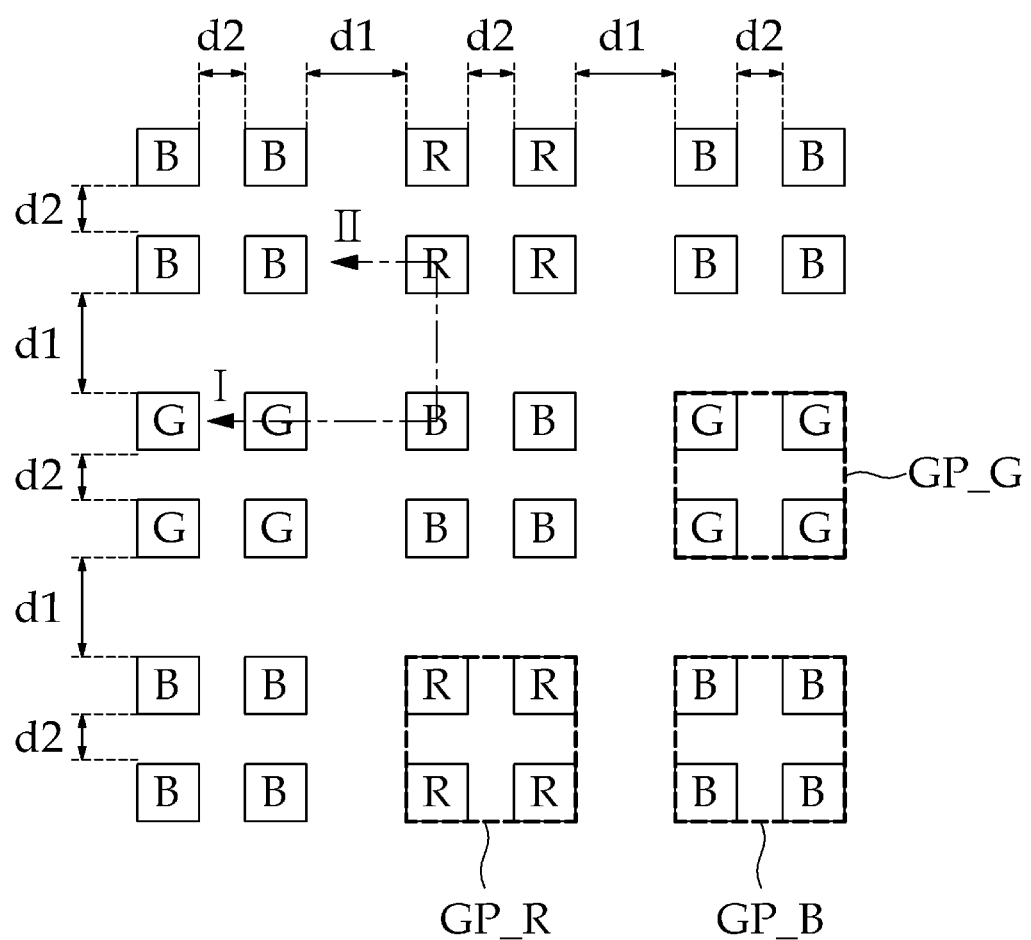
FIG. 2 is a schematic plan view illustrating a pixel array of a display device according to an embodiment of the present disclosure of invention.

FIG. 2 is a schematic plan view illustrating a pixel array of a display device according to an embodiment of the present disclosure of invention.

Referring to FIG. 2, each of red, green, and blue pixels according to an embodiment of the present disclosure of invention has a shape of a square or rectangle of which horizontal and vertical sides have predetermined lengths. A plurality of pixels representing the same color (e.g., any one of blue, green, and red) are disposed adjacent to each other as one group. In the specification, a plurality of pixels representing the same color is called a group pixel (GP). That is, a plurality of red pixels is commonly called a red group pixel (GP_R), a plurality of green pixels is commonly called a green group pixel (GP_G), and a plurality of blue pixels is commonly called a blue group pixel (GP_B).

The red, green, and blue group pixels according to an embodiment may be respectively disposed to be rectangular and may consist of four pixels that represent the same color. Referring to FIG. 2, each group pixel (GP) may consist of four pixels of which two pixels are disposed horizontally and of which the other two pixels are disposed vertically (that is, the four pixels are disposed in a matrix form of 2*2).

Each group pixel (GP) may be also disposed repeatedly.

For instance, the blue group pixels (GP_B) may be disposed diagonally to each other, and the red group pixel (GP_R) and the green group pixel (GP_G) may be disposed diagonally to each other.

Similarly, the red group pixels (GP_R) may be disposed diagonally to each other, and the blue group pixel (GP_B) and the green group pixel (GP_G) may be disposed diagonally to each other. Also, the green group pixels (GP_G) may be disposed diagonally to each other, and the red group pixel (GP_R) and the blue group pixel (GP_B) may be disposed diagonally to each other.

In the case of the pixel array according to an embodiment, one color may be represented by four pixels adjacent to each group pixel (GP) disposed horizontally, vertically, and diagonally. A blue pixel generally has lower luminance than red and green pixels, and thus one color may be represented by using two blue pixels, one red pixel, and one green pixel, thereby increasing luminance.

A distance d2 between pixels in the same group pixel may have a lower value than a distance d1 between adjacent pixels in different group pixels. In this case, the distance d1 between adjacent pixels in different group pixels may be the minimum distance to prevent a mixture of colors between the pixels. For example, d1 may be about 22 µm. That is, the distance d2 between pixels in the same group pixel may have a lower value than the minimum distance to prevent a mixture of colors between pixels.

As described above, in the case of a display device having the pixel array according to an embodiment, four pixels representing the same color may be simultaneously deposited using one mask opening. In general, as an opening of a mask becomes smaller in area, mask fabrication becomes difficult. However, in the display device having the pixel array according to an embodiment, an area of the mask opening is the same as that of the four pixels, and thus the mask fabrication is still easy even though the pixel area decreases due to higher resolution.

Further, each pixel may increase in size because the distance d2 between pixels in the same group pixel may be reduced more than the minimum distance d1 to prevent a color mixture. Therefore, although resolution increases, an aperture ratio of each pixel may increase.

Figure 3:
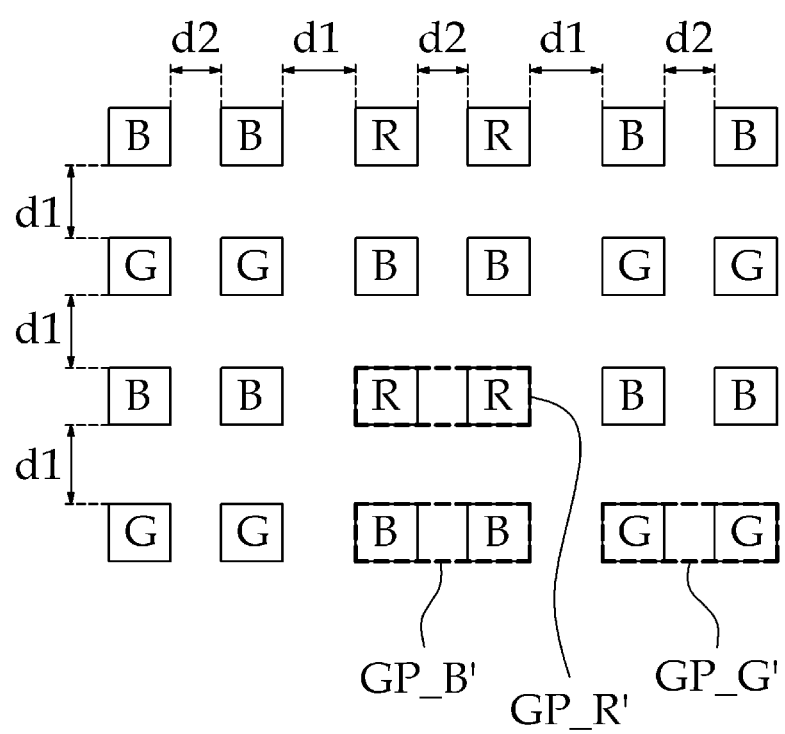
FIG. 3 is a schematic plan view illustrating a pixel array of a display device according to another embodiment of the present disclosure of invention.

FIG. 3 is a schematic plan view illustrating a pixel array of a display device according to another embodiment of the present disclosure of invention. Descriptions for the pixel array of a display device according to another embodiment, which are identical or analogous to those of the pixel array of a display device according to an embodiment, may not be repeated.

According to another embodiment, each of red, green, and blue group pixels (GP_R', GP_G', and GP_B' respectively) may be disposed to be rectangular, and each may consist of two pixels that represent the same color. Referring to FIG. 3, each group pixel may consist of two pixels that are disposed horizontally or vertically (that is, the two pixels are disposed in a matrix form of 2×1 or 1×2).

In the case of a display device having the pixel array according to another embodiment, two pixels representing the same color may be deposited simultaneously using one mask opening. In the display device having the pixel array according to another embodiment, the mask opening has the same area as the two pixels, and thus mask fabrication is still easy although the pixel area decreases due to higher resolution.

Further, each pixel may increase in size because the distance d2 between pixels in the same group pixel may be reduced more than the minimum distance d1 to prevent a color mixture. Therefore, although resolution increases, an aperture ratio of each pixel may increase.

Figure 4:
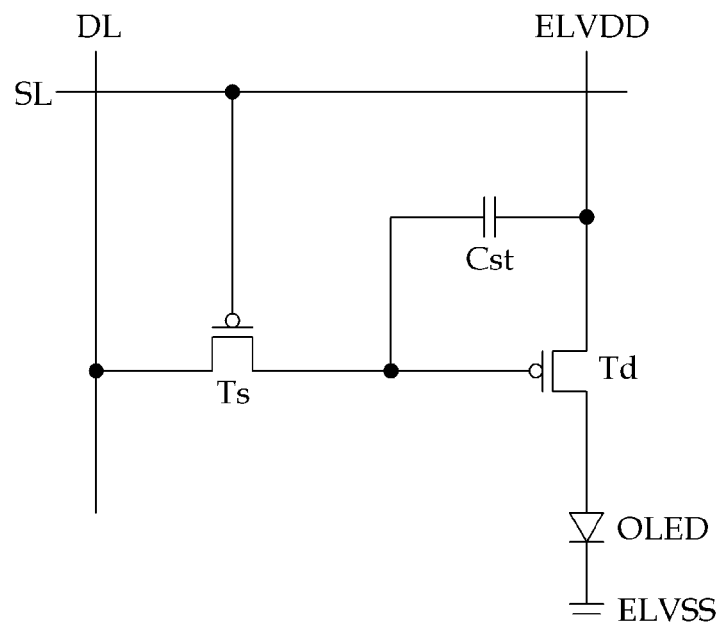
FIG. 4 is a schematic circuit diagram showing one pixel illustrated in FIG. 1.

FIG. 4 is a schematic circuit diagram showing one pixel illustrated in FIG. 1.

Referring to FIG. 4, a pixel defined by a scan line SL and a data line DL that intersect (e.g., cross) each other may include a switching transistor $T_s$ that is turned on by a scan signal applied through the scan line SL and transmits a data signal from the data line DL, a storage capacitor $C_{st}$ charged to a voltage proportional to the transmitted data signal, and a driving transistor $T_d$ configured to drive an organic light emitting diode (OLED) corresponding to the charged voltage.

In FIG. 4, the pixel is illustrated as having a structure of 2 Tr 1 C (i.e., two transistors and one capacitor), but embodiments are not limited thereto. The pixel may further include an additional transistor configured to compensate for threshold voltage of the driving transistor $T_d$ or to initialize the driving transistor $T_d$, and a compensation signal for driving the additional transistor. The transistors included in the pixel are PMOS transistors in this embodiment, but the transistors are not limited thereto. One or more of the transistors included in the pixel may be NMOS transistors in other embodiments.

Figure 5:
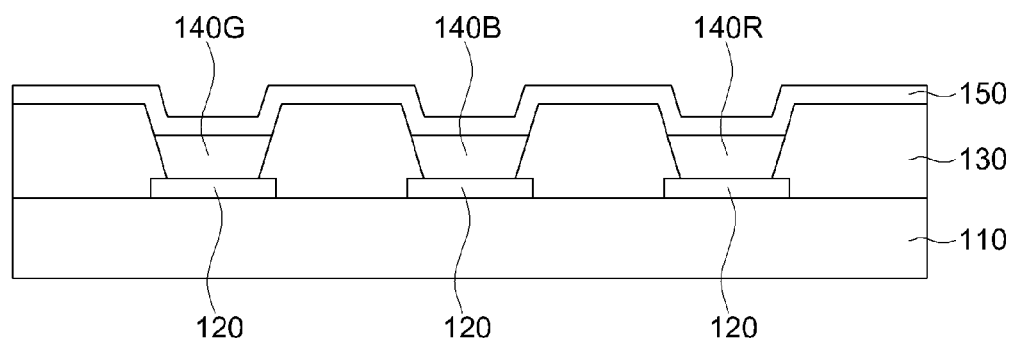
FIG. 5 is a cross-sectional view taken along the line I-II of FIG. 1.

FIG. 5 is a cross-sectional view taken along the line I-II of FIG. 2.

Referring to FIG. 5, a display device according to an embodiment may include a substrate 110, a first electrode 120 on the substrate 110, a pixel defining layer 130 between the first electrodes 120 and on an end portion of the first electrode 120, emission layers 140R, 140G, and 140B on the first electrodes 120, and a second electrode 150 on the emission layer. The emission layer may include red, green, and blue emission layers 140R, 140G, and 140B.

Although not illustrated, the emission layers 140R, 140G, and 140B may be applied on the pixel defining layer in the same group pixel. For example, the blue emission layer 140B may be applied on the pixel defining layer in the blue group pixel as well as on a pixel area of the blue group pixel.

The substrate 110 may be made of various materials such as glass, quartz, transparent resin, or of a flexible material. A transparent resin substrate may include, for example, polyimide resin, acrylic resin, polyacrylate resin, polycarbonate resin, polyether resin, polyethylene terephthalate resin, sulfonic acid resin, or the like.

The first electrode 120 may include a reflective layer made of at least one of gold (Au), platinum (Pt), nickel (Ni), tungsten (W), chromium (Cr), molybdenum (Mo), iron (Fe), cobalt (Co), copper (Cu), palladium (Pd), titanium (Ti), or compounds thereof. The first electrode 120 may include at least one transparent layer made of indium tin oxide (ITO), indium zinc oxide (IZO), aluminum-doped zinc oxide (AZO), zinc oxide (ZnO), or the like, which has higher work function than the reflective layer.

Although not illustrated in FIG. 5, a thin film transistor (TFT) and an insulating layer for protecting the TFT may be further included between the substrate 110 and the first electrode 120. In this case, at least one TFT may be formed for each pixel and may be electrically connected to the first electrode 120.

The pixel defining layer 130 may overlap an end portion of the first electrode 120 and may partition the first electrode 120 into pixels.

The emission layers 140R, 140G, and 140B may be disposed on the first electrode 120.

The blue emission layer 140B may include any one material selected from the group consisting of spiro-DPVBi, spiro-6P, distilbenzene (DSB), and distyrylarylene (DSA). The blue emission layer 140B may further include any one host material selected from 4,4'-N,N'-dicarbazole-biphenyl (CBP), Alq3, 9,10-dinaphthylanthracene (ADN), 4,4',4"-tri (N-carbazolyl)triphenylamine (TCTA), dmCBP, Liq, TPBI, Balq((Bis(2-methyl-8-quinlinolato-N1,O8)-(1,1'-Biphenyl-4-olato)aluminium), and BCP, and also any one dopant material selected from $F_2$Irpic, $(F_2ppy)_2$Ir(tmd), Ir(dfppz)$_3$, terfluorene, 4,4'-bis[4-(Diphenylamino)styryl]biphenyl (DPAVBi), and 2,5,8,11-tetra(t-butyl)perylene (TBP).

The red emission layer 140R may include any one host material selected from the group consisting of CBP and Balq, and also any one dopant material selected from Btp2Ir(acac) and (iridium(III)bis(1-phenylisoquinolyl)-N, C2')acetylacetonate.

The green emission layer 140G may include any one host material selected from the group consisting of CBP and Balq, and also any one dopant material selected from Ir(Mnpy)3, Btp2Ir(acac)(bis(2O-benzo[4,5-a]thienyl)

pyridinato-N,C3O)iridium(zcetylactonate), and Btp2Ir(acac)(iridium(III)bis(1-phenylisoquinolyl)-N,C2')acetylacetonate.

Although not illustrated in FIG. 5, a hole injection layer (HIL) and a hole transport layer (HTL) may be disposed under the emission layers 140R, 140G, and 140B to facilitate hole injection, and an electron transport layer (ETL) and electron injection layer (EIL) may be disposed over the emission layers 140R, 140G, and 140B to facilitate electron injection.

The second electrode 150 may include a light-transmissive metal. Examples of the light-transmissive metal may include at least one of a magnesium-silver (Mg—Ag) alloy, a lithium fluoride-aluminum (LiF—Al) alloy, a lithium-aluminum (Li—Al) alloy, Li, Ca, Ag, and Al, which have low work function. The second electrode 150 may have a uniform thickness in a range of 100 Å to 400 Å.

Figure 6A:
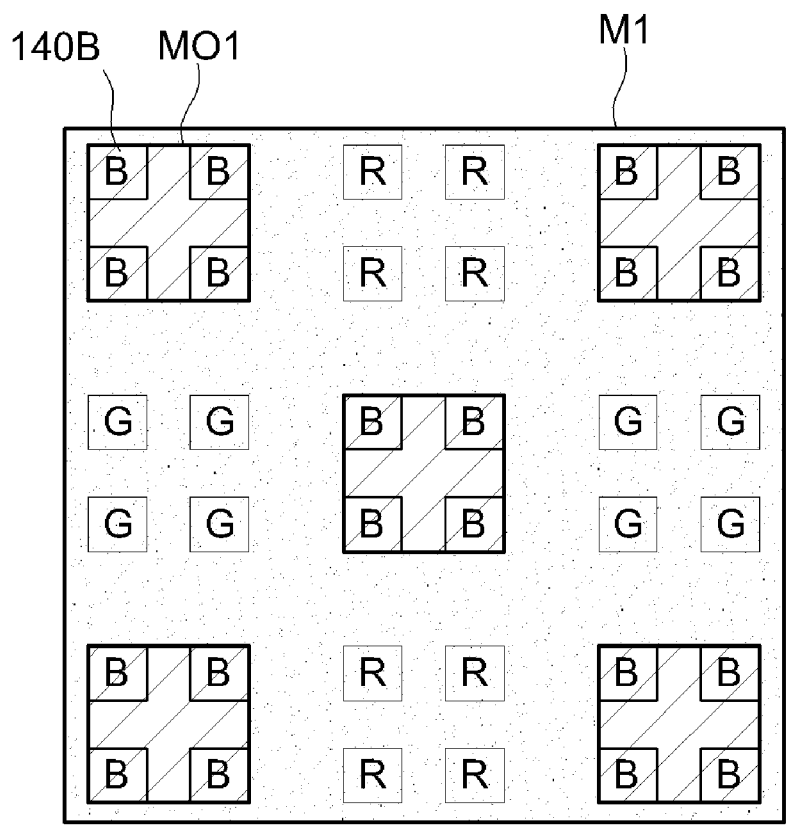
FIGS. 6A to 6C are plan views illustrating a method of manufacturing a display device according to an embodiment of the present disclosure of invention.
Figure 6B:
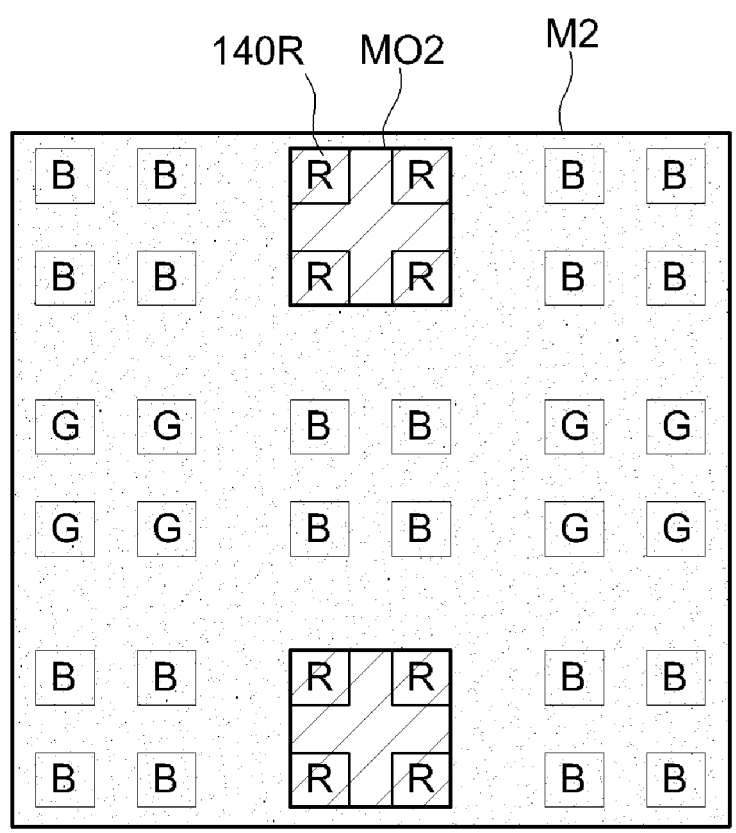
Figure 6C:
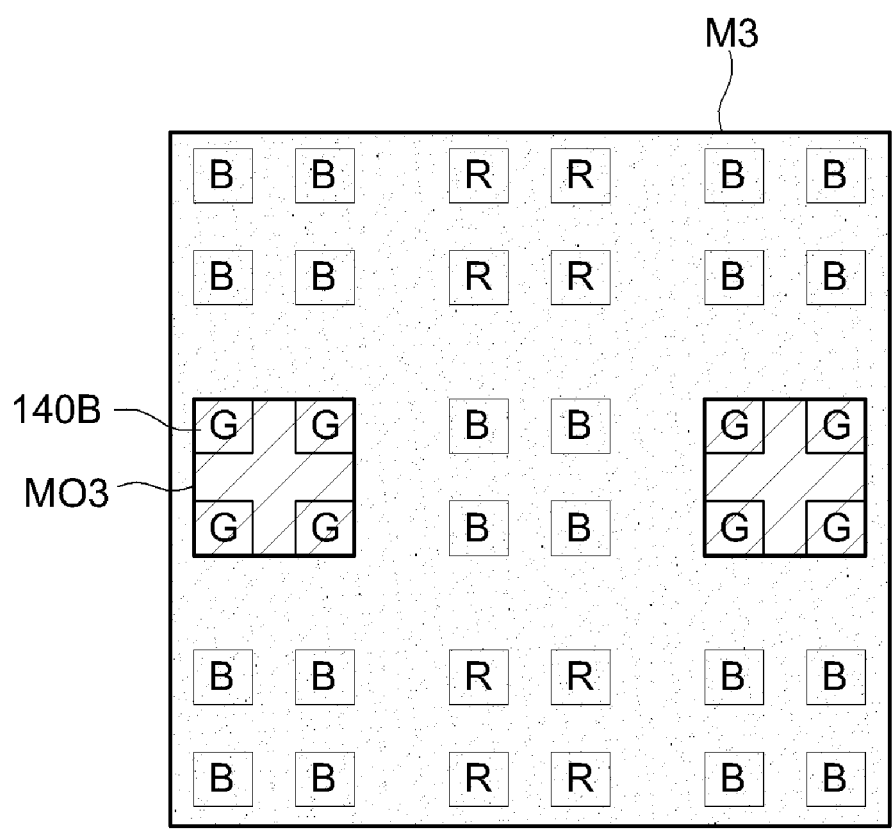
Figure 7A:
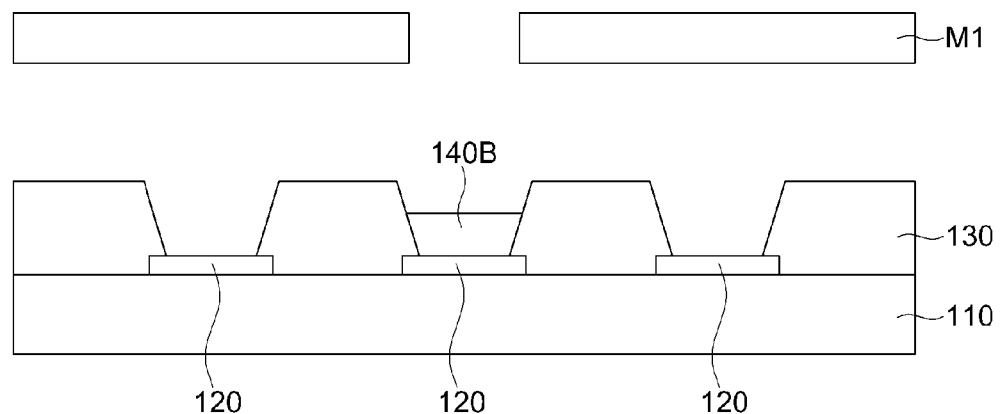
FIGS. 7A to 7C are cross-sectional views illustrating a method of manufacturing a display device according to an embodiment of the present disclosure of invention
Figure 7B:
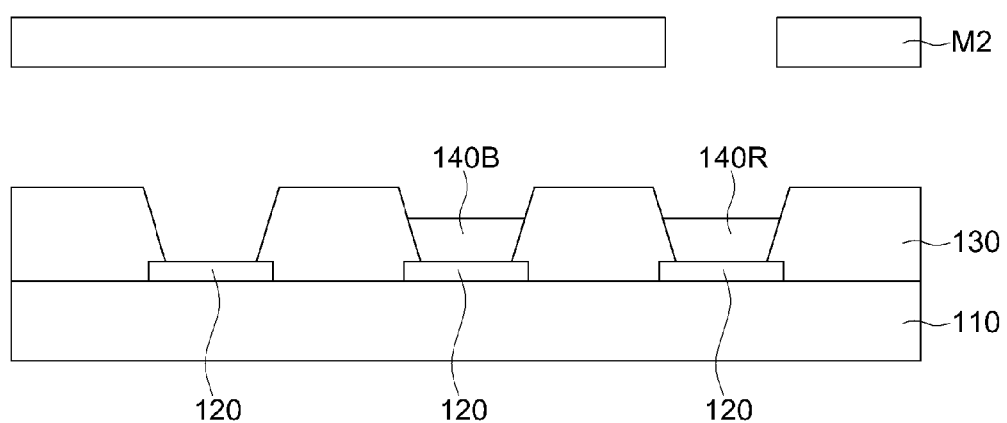
Figure 7C:
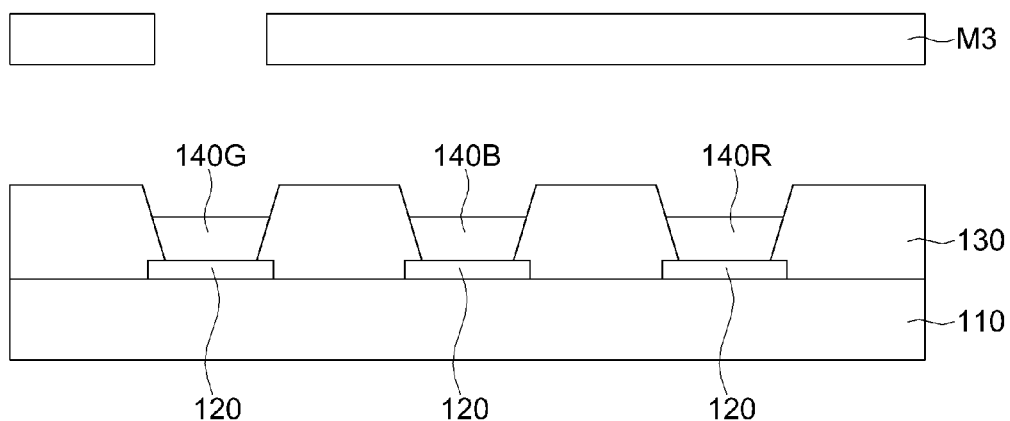

FIGS. 6A to 6C are plan views illustrating a method of manufacturing a display device according to an embodiment of the present disclosure of invention. FIGS. 7A to 7C are cross-sectional views illustrating a method of manufacturing a display device according to an embodiment of the present disclosure of invention.

Referring to FIGS. 6A and 7A, the blue emission layer 140B may be formed on the substrate 110 on which the first electrode 120 and the pixel defining layer 130 are formed. The blue emission layer 140B may be formed by using deposition utilizing a first mask M1 that exposes a plurality of blue group pixels at the same time.

A first opening MO1 in the first mask M1 may have an area greater than or equal to the blue group pixel corresponding to the blue group pixel on the substrate 110. A blue-emitting material is deposited on the blue group pixel on the substrate 110 through the first opening MO1, and thus the blue emission layer 140B may be applied on a blue pixel area in the blue group pixel and also on the pixel defining layer 130. Therefore, as resolution increases, the area of the first opening MO1 in the first mask M1 may not be substantially reduced even though one blue pixel area is reduced.

Next, referring to FIGS. 6B and 7B, the red emission layer 140R may be formed on the substrate 110. The red emission layer 140R may be formed by using deposition utilizing a second mask M2 that exposes a plurality of red group pixels at the same time.

A second opening MO2 in the second mask M2 may have an area greater than or equal to the red group pixel corresponding to the red group pixel on the substrate 110. A red-emitting material is deposited on the red group pixel on the substrate 110 through the second opening MO2, and thus the red emission layer 140R may be applied on a red pixel area in the red group pixel and also on the pixel defining layer 130. Therefore, as resolution increases, the area of the second opening MO2 in the second mask M2 may not be substantially reduced even though one red pixel area is reduced.

Next, referring to FIGS. 6C and 7C, the green emission layer 140G may be formed on the substrate 110. The green emission layer 140G may be formed by using deposition utilizing a third mask M3 that exposes a plurality of green group pixels at the same time.

A third opening MO3 in the third mask M3 may have an area greater than or equal to the green group pixel corresponding to the green group pixel on the substrate 110. A green-emitting material is deposited on the green group pixel on the substrate 110 through the third opening MO3, and thus the green emission layer 140G may be applied on a green pixel area in the green group pixel and also on the pixel defining layer 130. Therefore, as resolution increases, the area of the third opening MO3 in the third mask M3 may not be substantially reduced even though one green pixel area is reduced.

The first to third masks M1 to M3 may be a fine metal mask (FMM).

Although not illustrated, the second electrode 150 may be formed on the entire substrate 110 after the emission layers 140R, 140G, and 140B are deposited on the substrate 110. An encapsulation process may be further performed after the second electrode 150 is formed.

Thus, in the case where a display device has a pixel array according to embodiments of the present disclosure, although each pixel area is reduced to realize high resolution, a plurality of pixels are formed utilizing one mask opening, thereby facilitating mask fabrication for deposition.

Further, a color mixture may not occur between a plurality of pixels in a group pixel, and thus a distance between respective pixels in the same group pixel may decrease. Consequently, each pixel size may increase, thereby enhancing an aperture ratio.

From the foregoing, it will be appreciated that various embodiments in accordance with the present disclosure have been described herein for purposes of illustration, and that various modifications may be made without departing from the scope and spirit of the present teachings. Accordingly, the various embodiments disclosed herein are not intended to be limiting of the true scope and spirit of the present teachings.

Figure 8:
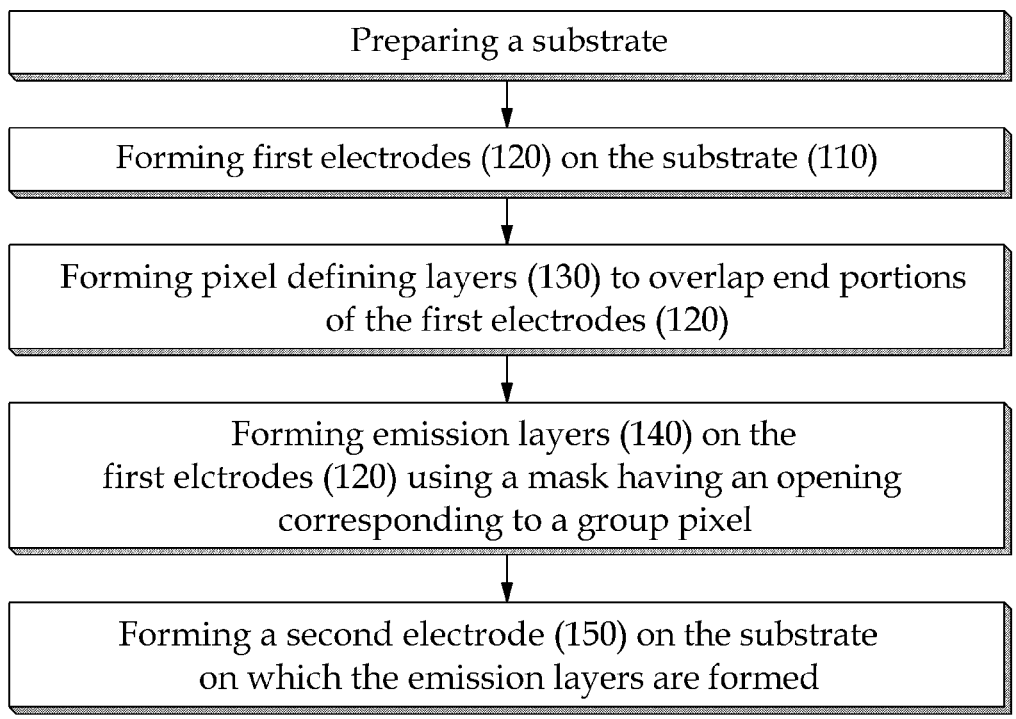
FIG. 8 is the flow-chart indicating a method of manufacturing of a display device of an embodiment of the present application.

FIG. 8 is a flow-chart showing a method of manufacturing of a display device of an embodiment of the present application. Referring to FIG. 8, a method for manufacturing a display device having group pixels comprising the steps of reparing a substrate; forming a first electrode on the substrate; forming an emission layer on the first electrode; and forming a second electrode on the substrate on which the emission layer is formed, wherein the forming of an emission layer uses a mask having an opening corresponding to a group pixel in which a plurality of pixels representing the same color are disposed to be rectangular. The processing of this method in FIG. 8 is illustrated in the previously described FIGS. 5A-6C, and cross section of a final product is shown in the previously described FIG. 4.

What is claimed is:
1. A display device comprising:
a substrate; and
a group pixel of one color on the substrate,
the group pixel comprising at least two pixels that represent the same color, and
a distance between the pixels in the group pixel is smaller than a least distance between the group pixel and a neighboring group pixel in vertical direction and a least distance between the group pixel and another neighboring group pixel in horizontal direction.

2. The display device of claim 1, wherein the group pixel comprises four pixels that are disposed to define a shape of the group pixel as rectangular.

3. The display device of claim 2, wherein the group pixel comprises four pixels of which two pixels each are disposed horizontally and vertically.

4. The display device of claim 1, wherein the group pixel comprises two pixels disposed horizontally or vertically.

5. The display device of claim 1, further comprised of: the group pixel displaying any one of red, green, and blue, the blue group pixel being disposed diagonally, and the red and green group pixels being disposed diagonally to each other.

6. The display device of claim 1, further comprised of: the group pixel displaying any one of red, green, and blue, the red group pixel being disposed diagonally, and the blue and green group pixels being disposed diagonally to each other.

7. The display device of claim 1, further comprised of: the group pixel displaying any one of red, green, and blue, the green group pixel being disposed diagonally, and the red and blue group pixels being disposed diagonally to each other.

8. The display device of claim 1, wherein the pixel comprises:
- a first electrode disposed on the substrate, the first electrode comprising a plurality of first sub-electrodes;
- a pixel defining layer disposed between the first sub-electrodes and on an end portion of the first electrode;
- an emission layer on the first electrode; and
- a second electrode on the emission layer.

9. The display device of claim 8, wherein the emission layer is applied on the pixel defining layer in the same group pixel as the pixel defining layer.

10. The display device of claim 1, the distance between the pixels in the group pixel has a value smaller than the least distance that prevents a mixture of different colors between pixels.

11. The display device of claim 1, the least distance between the neighboring pixels in the different group pixels is not smaller than the least distance that prevents a mixture of different colors between pixels.

12. The display device of claim 1, the least distance between the neighboring pixels in the different group pixels is about 22 μm.

13. The display device of claim 1, each of the pixels increasing in size when the distance between the pixels in the group pixel is reduced.

* * * * *